(12) United States Patent
Toriyama et al.

(10) Patent No.: US 6,347,005 B1
(45) Date of Patent: Feb. 12, 2002

(54) ELECTRO-OPTIC SAMPLING PROBE

(75) Inventors: Noriyuki Toriyama, Tokyo; Tadao Nagatsuma, Sagamihara; Mitsuru Shinagawa, Isehara; Junzo Yamada, Ebina, all of (JP)

(73) Assignees: Ando Electric Co., Ltd.; Nippon Telegraph and Telephone, both of Tokyo (JP)

( * ) Notice: Subject to any disclaimer, the term of this patent is extended or adjusted under 35 U.S.C. 154(b) by 0 days.

(21) Appl. No.: 09/483,689

(22) Filed: Jan. 14, 2000

(30) Foreign Application Priority Data

Jan. 20, 1999 (JP) .............................. 11-012492

(51) Int. Cl.$^7$ .................... G02F 1/03; G01R 31/308; G01R 27/22
(52) U.S. Cl. ................. 359/245; 359/254; 324/753; 324/96
(58) Field of Search .................. 359/245, 254; 324/96, 750–753

(56) References Cited

U.S. PATENT DOCUMENTS

| 3,784,315 A | * | 1/1974 | O'Brien ................. 408/92 |
| 3,969,841 A | * | 7/1976 | Joseph .................. 46/268 |
| 4,134,738 A | * | 1/1979 | Bress et al. ............. 48/85.2 |
| 5,274,325 A | | 12/1993 | Shinagawa et al. ..... 324/158 R |
| 5,295,407 A | * | 3/1994 | Hirose et al. ............ 74/459 |
| 5,592,101 A | * | 1/1997 | Takahashi et al. ......... 324/753 |

FOREIGN PATENT DOCUMENTS

EP  0 580 446 A1  1/1994

* cited by examiner

*Primary Examiner*—Georgia Epps
*Assistant Examiner*—Tim Thompson
(74) *Attorney, Agent, or Firm*—Darby & Darby

(57) ABSTRACT

An electro-optic sampling probe used for observing a waveform of a test signal based on the change of the polarization state of a light pulse caused when the light pulse generated based on a timing signal is entered in an electro-optic crystal that is coupled by an electric field generated by the test signal. The electro-optic sampling probe includes an electro-optic crystal having a stopper portion at its upper portion, an electro-optic crystal supporting portion for supporting the electro-optic crystal by the stopper portion so as not to fall and capable of moving the electro-optic crystal vertically and an electro-optic crystal driving portion formed by a base and a board, to which the electro-optic crystal supporting portion is attached which moves on the base, for rectilinearly moving the electro-optic crystal along the direction of an optical axis.

9 Claims, 6 Drawing Sheets

ELECTRO-OPTIC SAMPLING PROBE

BACKGROUND OF THE INVENTION

1. Field of the Invention

The present invention relates to an electro-optic (hereinafter, abbreviated as EO) sampling probe, which is used for observing an waveform of a test signal based on a change of the polarization state of a light pulse caused when the light pulse generated based on the timing signal is admitted into an electro-optic crystal which is coupled with an electric field generated by the test signal, and particularly relates to an electro-optic sampling probe provided with an improved probe optical system.

2. Background Art

First, the principle of the electro-optic (hereinafter, abbreviated as EO) sampling measurement will be described with reference to FIGS. 4 and 5.

In FIG. 4, the reference numeral 10 denotes a test object such as a semiconductor IC wafer etc., which is connected to an electric signal probe 33, and to which electric signals from a signal generator 34 are supplied. The test object 10 is operated based on the electric signals.

The reference numeral 1 denotes the electro-optic crystal (hereinafter, called the EO crystal). The numeral 5 denotes an object glass for-condensing light incident on the EO crystal 1. The numeral 6 denotes an observing optical system comprising a dichroic mirror 29, a half mirror 23, and an observing light source 26. The numeral 22 denotes an EO sampling optical system comprising a photo-diode (not shown) and a light isolator (not shown), and a fiber collimator 30 is disposed at one end of the EO sampling optical system 22. The numeral 21 denotes a pulse laser light source for supplying light to the fiber collimator 30.

The reference numeral 27 denotes an infrared camera for localization of the laser light in order to condense the light onto a wiring pattern on the test object 10, and the alignment is confirmed by use of an image monitor 28. The numeral 35 is an XY stage for aligning the test object. The numeral 24 denotes a differential amplifier for differentially amplifying an output signal obtained when the change of the polarization state of the laser light is converted into an electric signal by means of the EO sampling optical system 22. The numeral 25 denotes a waveform indicator for indicating the electric signal.

Next, referring to FIG. 4, the path of the laser light emitted from the pulse laser source 21 is described.

First, the laser light admitted into the EO sampling optical system 22 through an optical fiber from the pulse laser source 21 is collimated by the fiber collimator 30 and admitted into the observing optical system 6 after rectilinearly propagating in the EO sampling optical system 22. The laser light further rectilinearly propagates in the observing optical system 6 and is then condensed on the test object 10 through the EO crystal 1 by the objective lens 5.

The wavelength used in this sampling optical measurement is 1550 nm. The dichroic mirror 29 is characterized by the transmittance and reflectance for the light of the wavelength of 1550 nm being 95% and 5%, respectively, and the transmittance and reflectance for a light having an wavelength of 1300 nm is 20% and 80%, respectively. Accordingly, 95% of the laser light emitted by the pulse laser source 21 is transmitted and irradiated on the test object 10.

The light beam reflected by the test object is collimated into a parallel beam again by the objective lens 5, and returns to the EO sampling optical system 22 through the same light path as that for entering the photodiode (not shown) in the EO sampling optical system.

An explanation is described hereinafter of the path of light emitted by the observing light source 26 in the case of executing alignment of the test object by use of the observing light source 26 and the infrared camera 27. The lamp used for the observing light source 26 is a halogen lamp which emits light having wavelengths ranging from 400 to 1650 nm.

The light beam, emitted from the observing light source 26, passes the half mirror 23, advances rectilinearly, and irradiates the test object after being turned at a right angle by the dichroic mirror 29. The half mirror 23 used in this optical system is a mirror, in which both transmittance and reflectance are equal to 50%.

The infrared camera 27 takes a photograph of a part of the test object, irradiated by the observation light source 26 in the view field of the objective lens 5, and the obtained infrared image is displayed on the monitor 28.

An operator moves the XY stage 35 slowly while watching the image displayed on the monitor 28, and adjusts the position of the wiring to be tested on the test object so as to enter into the view field.

Furthermore, the laser beam, entering into the EO sampling optical system from the pulse laser source 21 through the optical fiber, is reflected at the side of the EO crystal facing to the wiring. The reflected light, then reflectively bent at a right angle by the dichroic mirror 29, and again bent at an right angle by the half mirror 23, is verified by the operator from the images of the infrared camera 27, and the operator moves the XY stage such that the laser beam is condensed on a point on the wiring surface to be tested. At this time, the laser beam can be verified by the infrared camera 27 because the dichroic mirror 29 has a reflectance of 5% for light having the wavelength of the laser light.

Next, a test operation for measuring the test signal by use of an apparatus of the EO sampling measurement is described.

When a voltage is applied to the wiring on a test object, the phenomenon occurs that, due to the Pockels effect, the index of the double refraction of the EO crystal changes depending on the electric field applied to the EO crystal.

Thereby, when the laser light is entered into the EO crystal and propagates through the EO crystal, the polarization state of the laser light changes. The laser beam, after being subjected to the change of its polarization state, is reflected at the EO crystal surface facing to the wiring, and again impinges on the EO sampling optical system 22.

The light beam impinging on the EO sampling optical system 22 is isolated by a light isolator (not shown) in the EO sampling optical system 22. The isolated light is received by a diode (not shown), which converts it into an electric signal. The electric signal is amplified by the differential amplifier 24 and is then displayed on the waveform indicator 25, so that the measurement of the electric signal applied to the wiring on the test object 10 can be executed.

The principle of the EO sampling is shown in FIG. 5. When a signal is applied on the EO crystal, the change of the electric field in the crystal by the applied signal causes a change of the index of the double diffraction of the EO crystal due to the Pockels effect. When a laser beam passes through the thus changed crystal, the polarization state of the laser light changes according to the change of the double refractive index, so that it becomes possible to measure the change of the electric field, that is, the change of the signal, by measuring the change of the polarization state of the laser light.

In order to execute the above described measurement, it is necessary to place the EO crystal on the test object. Conventionally, an operator has placed the EO crystal 1 on the test objects 10, such as a semiconductor wafer or the like, using tweezers. However, the problem arises that the placement must be executed very carefully so as not to damage the test object, so that the conventional measurement has been difficult and can be successfully executed only by experienced operators.

There is a conventional method reported in a paper entitled "An on-wafer EO probing system for internal diagnosis of the ultra high speed IC" (C-309, Proceeding of Electronic Information Communication Society, 1992) The constitution of the probing system reported in the above paper is shown in FIGS. 6 and 7.

FIG. 6 is a perspective view of the whole system, and FIG. 7 is a cross-sectional view of the system shown in FIG. 6.

In FIGS. 6 and 7, the reference numeral 10 denotes a test object such as a silicon wafer. The numeral 51 denotes an EO crystal. The numeral 52 denotes an objective lens, 53 a cylinder, 54 an air guide, and 55 a linear actuator. The numeral 56 denotes a position scale, 57 a balance mechanism, and 58 denotes a chuck for fixing the test object.

This system is a mechanism comprising the linear actuator 55 (a piezoelectric element), a balance mechanism 57, an air guide 54, a position scale 56, etc, and this system is added to an apparatus shown in FIG. 4 which allows automatic alignment of the EO crystal on the test object.

The measurement using the above mentioned mechanism is implemented by the steps of, first aligning the test object at a measuring location, and then the EO crystal 51 mounted at the bottom of a cylinder 53 is lowered until the EO crystal contact the test object. Since the combination of the EO crystal and the cylinder is integrated and heavy, the effective mass of the combination is reduced by the balance mechanism 57 in order to prevent an excess force from being applied to the test object. The contact height of the EO crystal with the test object is detected by the position scale 56, and the measurement is executed after raising the EO crystal by 1 μm to the contact surface in order to maintain a narrow space between the EO crystal and the test object.

The above mechanism has high alignment accuracy. However, problems arise in that it takes the considerable time of 5 to 10 seconds because complicated and fine aligning is required, and in that the apparatus is complicated and expensive.

SUMMARY OF THE INVENTION

The present invention is made in order to solve the above mentioned problems. Therefore, the objective of the present invention is to provide a electro-optic sampling probe, which is simple in structure and which can be operated by an operator without requiring extensive training.

The electro-optic sampling probe according to the present invention is used for observing a waveform of a test signal based on the change of the polarization state of a light pulse caused when the light pulse generated by the timing signal is admitted into an electro-optic crystal which is coupled with an electric field generated by the test signal.

According to the first aspect of the present invention, the electro-optic sampling probe comprises an electro-optic crystal having a stopper portion at its upper portion; an electro-optic crystal supporting portion for supporting said electro-optic crystal by said stopper so as not to fall and capable of moving said electro-optic crystal up and down; and an electro-optic crystal driving portion, to which said electro-optic crystal supporting portion is attached, for rectilinearly moving said electro-optic crystal along the direction of an optical axis.

According to the second aspect, said electro-optic crystal driving portion is moved rectilinearly by a driving lever provided with a fulcrum supported at an observing optical system body.

According to the third aspect, said electro-optic crystal driving portion is moved rectilinearly by a rack and a pinion.

According to the fourth aspect, said electro-optic crystal driving portion is moved rectilinearly by a motor and a feed screw.

According to the fifth aspect, said electro-optic crystal driving portion is moved rectilinearly by an eccentric cam.

DETAILED DESCRIPTION OF THE INVENTION

Hereinafter, an electro-optic sampling probe according to the first embodiment of the present invention is described with reference to FIG. 1.

Figure 1:
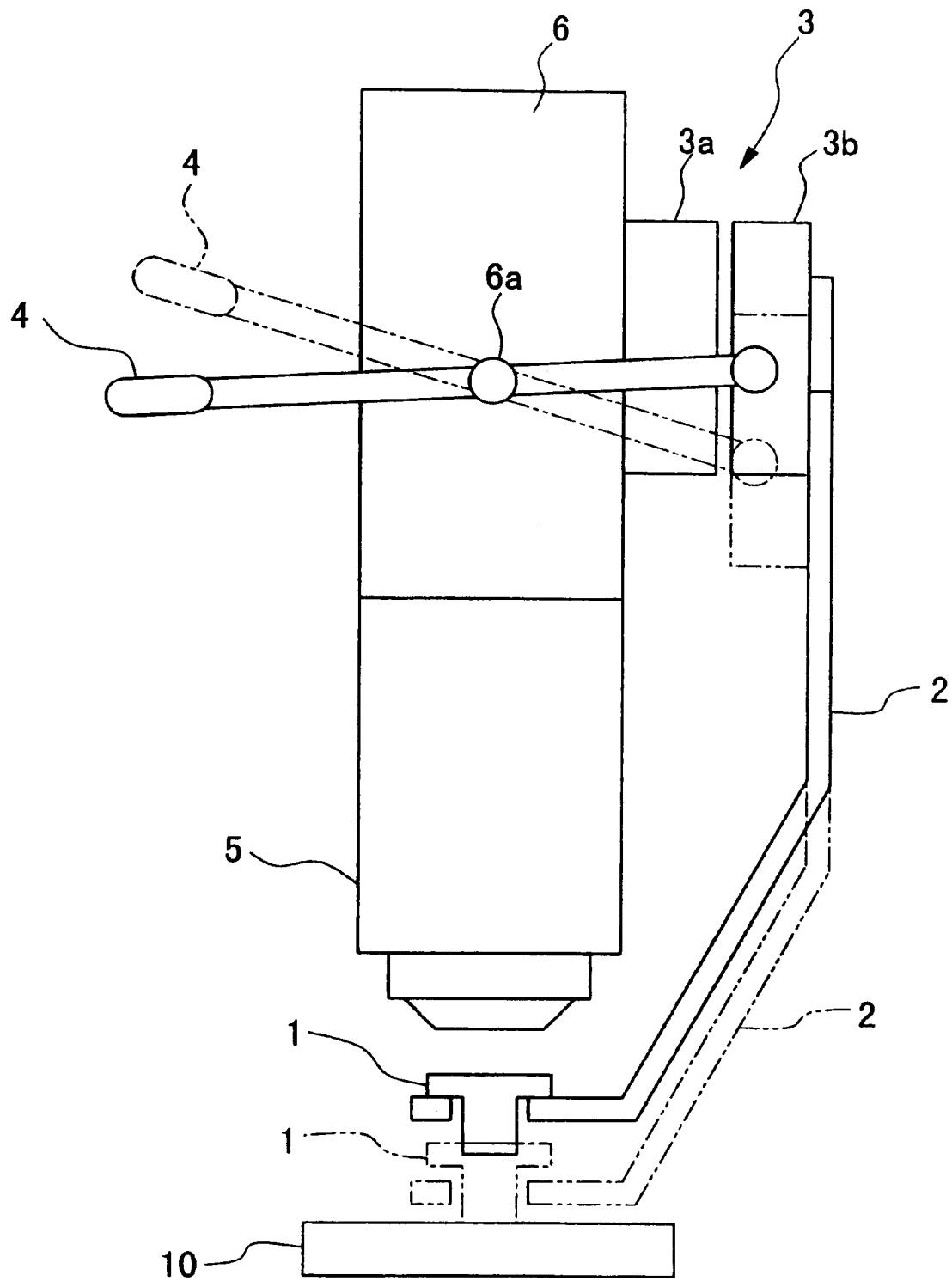
FIG. 1 is a side view showing the first embodiment of the present invention.

FIG. 1 is a side view showing the first embodiment of the present invention. Referring to FIG. 1, the numeral 1 denotes an EO crystal, 2 denotes a supporting portion of the EO crystal. The EO crystal 1 is not fixed to the EO crystal supporting portion 2, and the EO crystal is simply inserted into a hole of the supporting portion 2. Since a brim-like plate is formed on the EO crystal 1, the EO crystal 1 is suspended in the hole of the EO supporting portion. Since the diameter of the EO crystal 1 is smaller than the hole diameter, the EO crystal can be easily removed by pulling it out.

The numeral 3 denotes a driving portion of the EO crystal, which comprises a linear moving base 3a fixed at the observing optical system 6 and a linear sliding board 3b which slides on the linear moving base 3a. The numeral 4 denotes a lever for moving the driving portion 3 and the lever 4 is movable vertically as shown by a two-dot chain line about a fulcrum 6a provided on the observing optical system. The EO crystal supporting portion 2 is fixed to the sliding board 3b, so that it goes down as shown by the two-dot chain line by moving the lever 4.

The numeral 10 denotes a test object. The objective lens 5 is fixed on the observing optical system 6.

Next, the operation of the electro-optic sampling probe shown in FIG. 1 is described. While maintaining the EO crystal 1 at a raised position by lowering the lever 4, the test object 10 is moved to a measuring position while observing the test object 10 on the monitor 28.

Once the position of the test object is aligned, the EO crystal is lowered by raising the lever 4. When the EO crystal is lowered, the EO crystal is hung down 0.3 to 0.5 mm apart from a stopper of the EO crystal supporting portion 2, so that only the EO crystal is placed on the test object. The present system is designed such that the EO crystal can be held firmly by notches or by stoppers both in the bottom dead center at the lowered bottom position, shown by the two-dot chain line in FIG. 1, and at the top dead center in the raised top position, shown by the full line in FIG. 1, such that the EO crystal can be supported at dead centers so as not to be moved by, for example, gravity.

Accordingly, only the force corresponding to the weight of the EO crystal is applied to the test object, and thus alignment can be executed without damaging the test object. The above mentioned measurement is executed while holding the EO crystal in this state.

The second embodiment of the present invention is described with reference to FIG. 2.

The point which distinguishes the second embodiment from the first embodiment is that the EO crystal supporting portion 2 is moved rectilinearly by a combination of a rack and a pinion in place of the lever 4.

Figure 2:
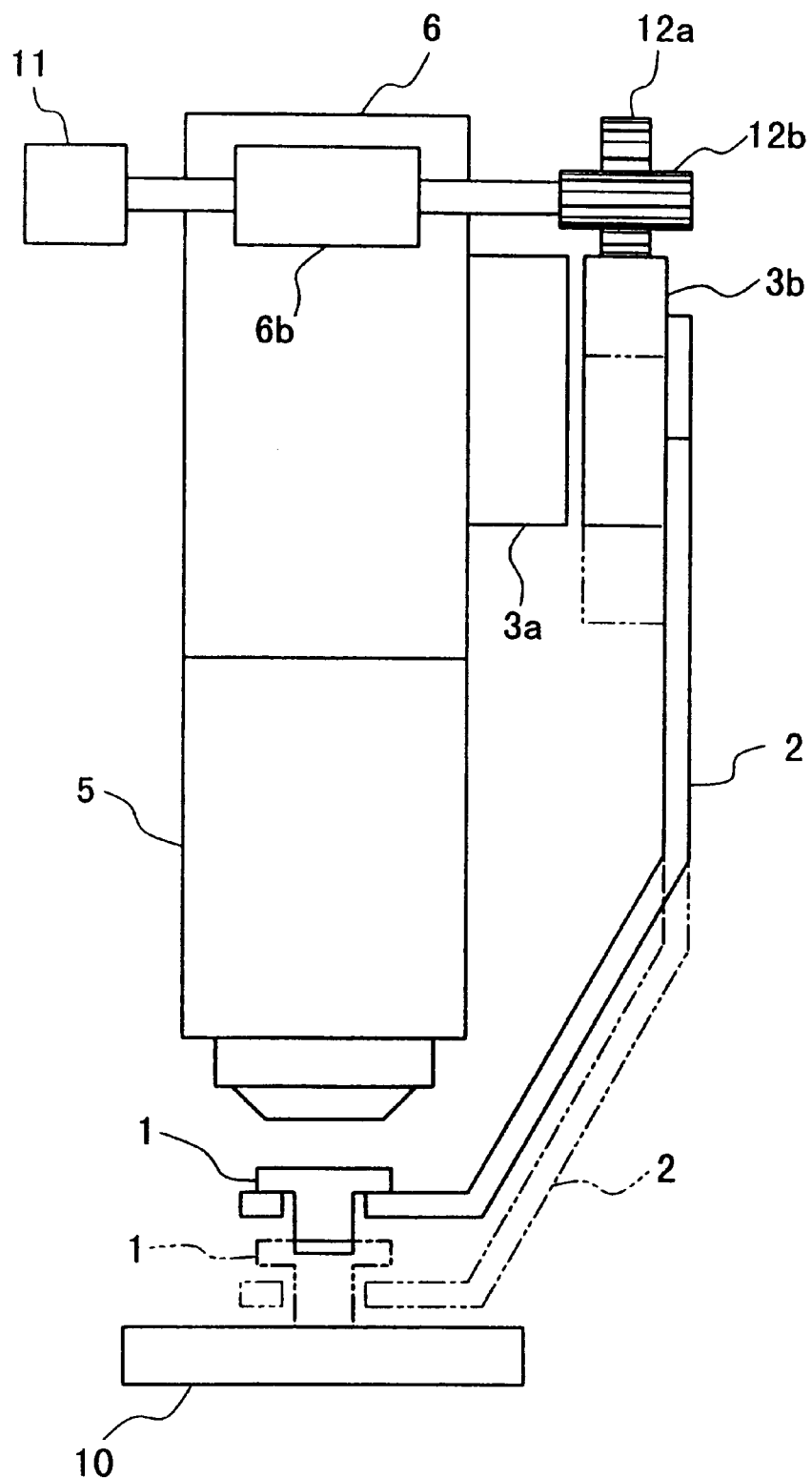
FIG. 2 is a side view showing the second embodiment of the present invention.

In FIG. 2, the numeral 12a denotes the rack fixed at the linear sliding board 3b, and the numeral 12b denotes the pinion which rotates by rotating a turn knob 11. The turn knob 11 and the pinion 12b are supported by the supporting portion 6b. The vertical movement of the EO crystal 1 is carried out by the rotation of the turn knob 11.

Next, the third embodiment of the present invention is described with reference to FIG. 3.

The point which distinguishes the third embodiment from the first embodiment is that the EO crystal supporting portion 2 is moved rectilinearly by a combination of a motor and a feed screw in place of the lever 4.

Figure 3:
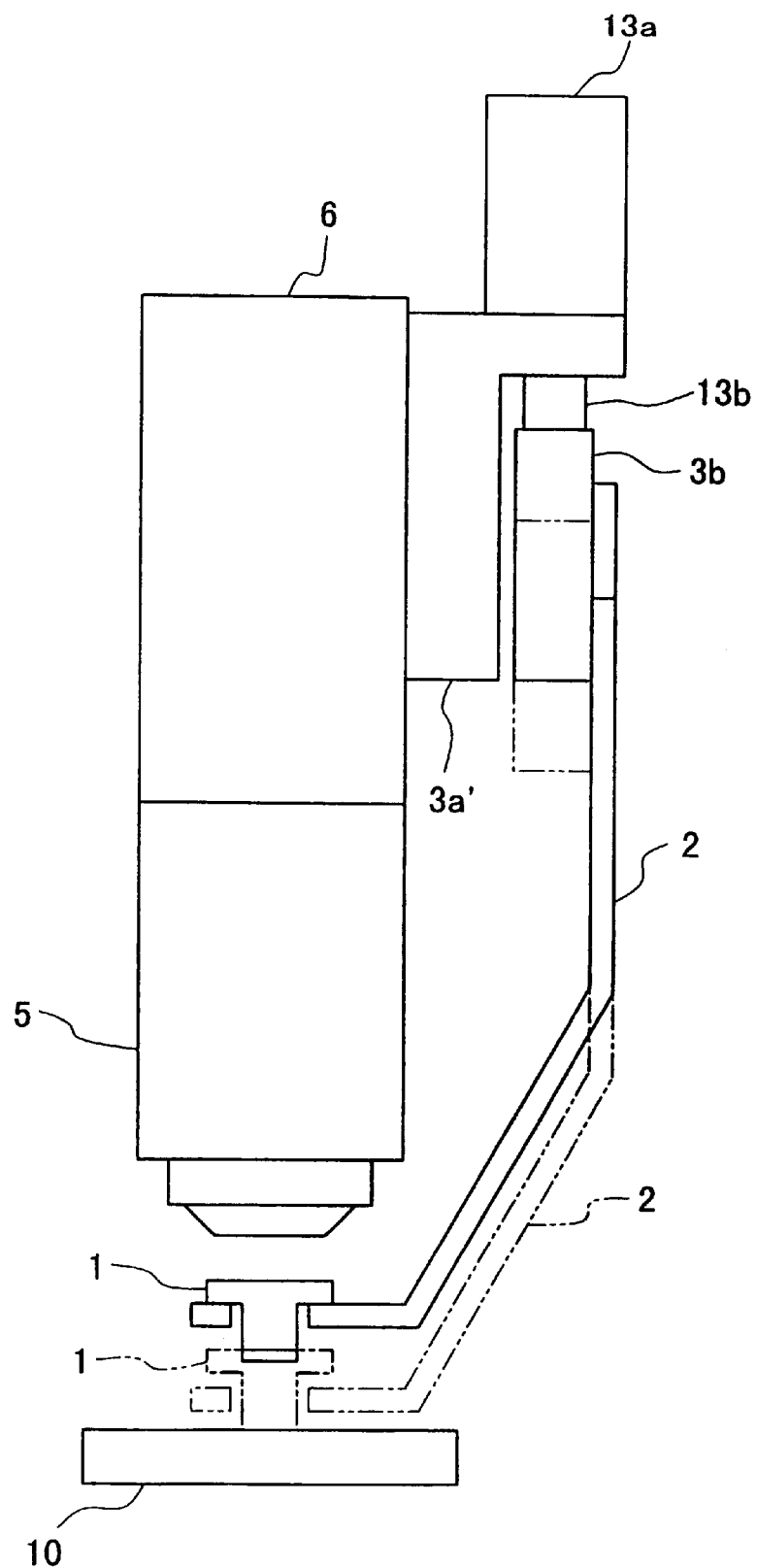
FIG. 3 is a side view showing the third embodiment of the present invention.
Figure 4:
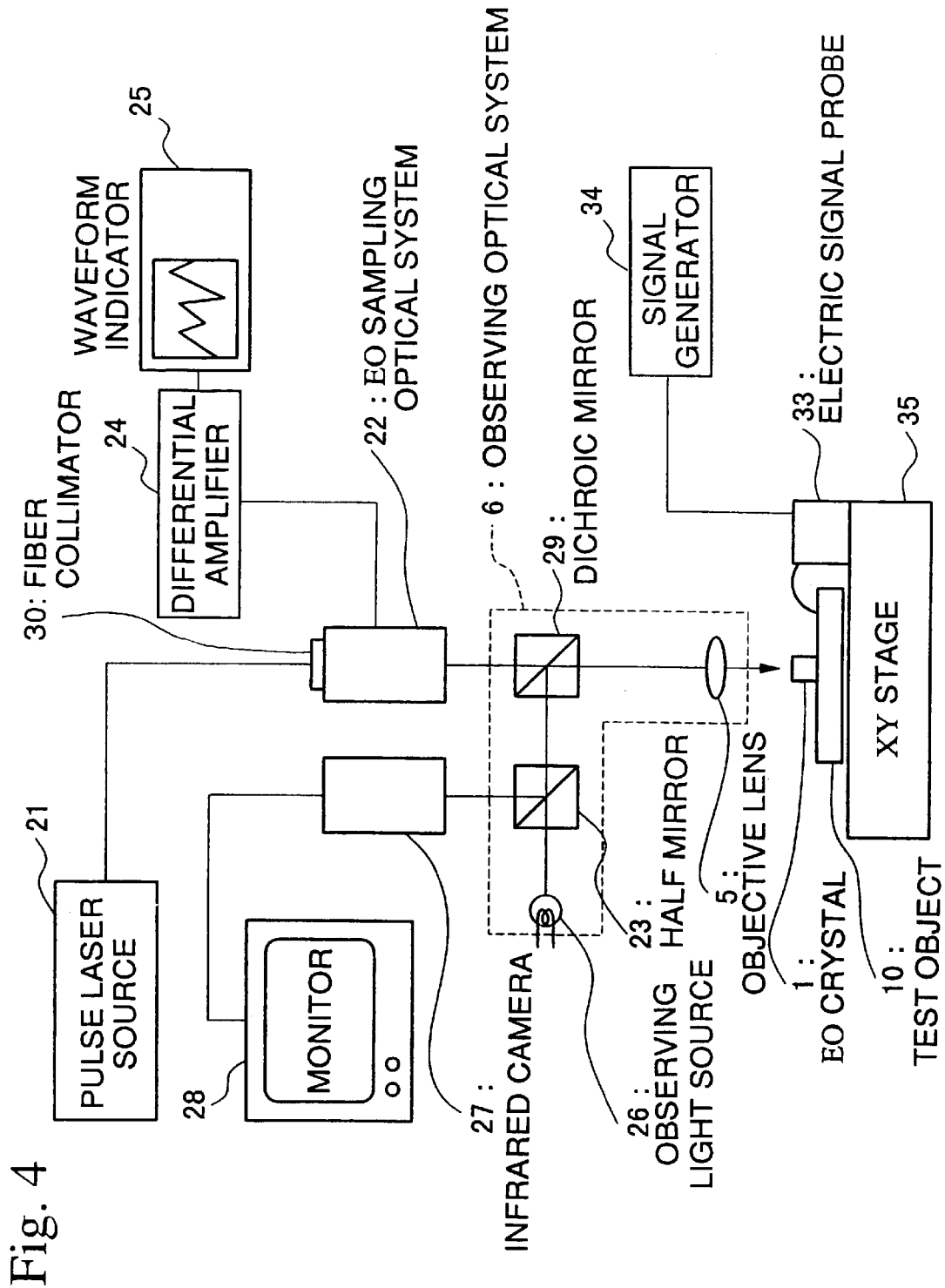
FIG. 4 is a block diagram showing a structure of an electro-optic sampling probe as a whole.
Figure 5:
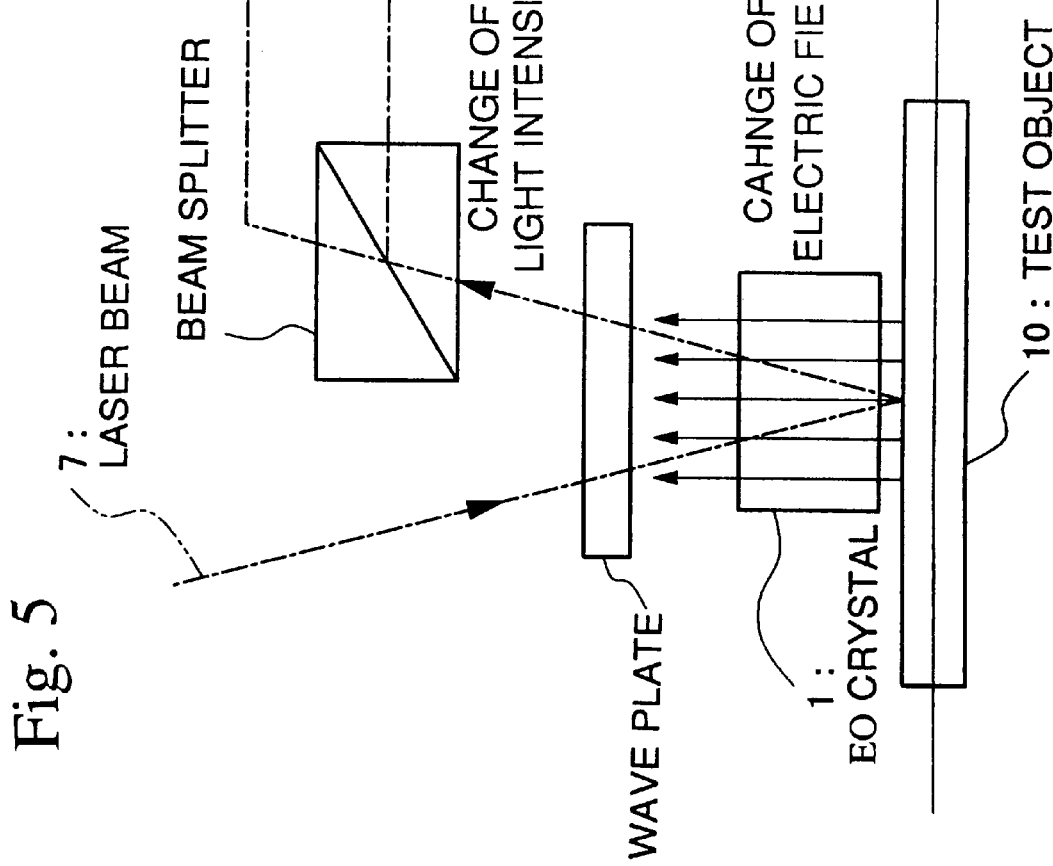
FIG. 5 is a diagram for explaining the principle of the electro-optic sampling.
Figure 6:
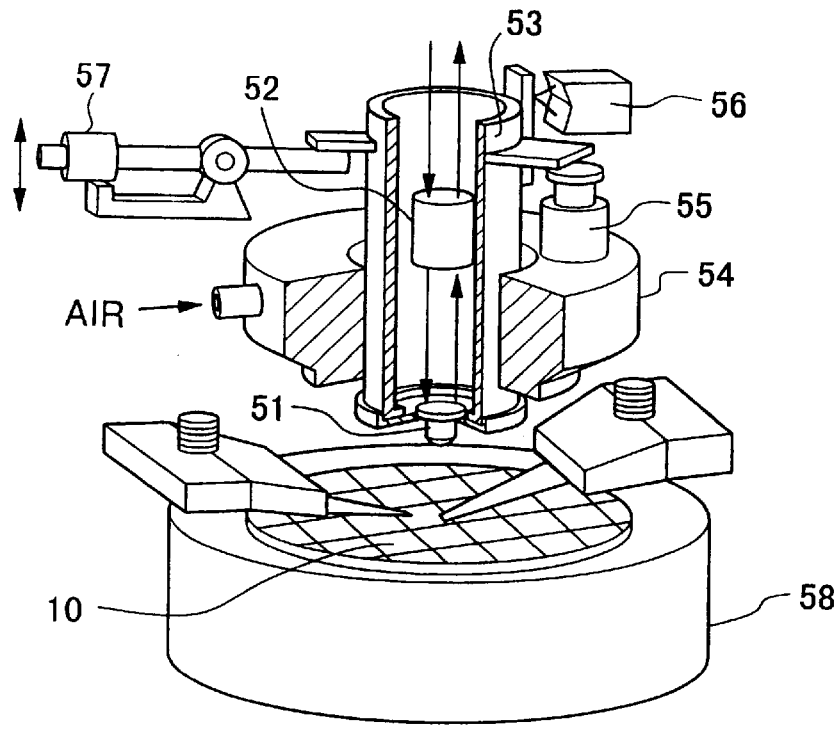
FIG. 6 is a perspective view showing the structure of the conventional electro-optic sampling probe.
Figure 7:
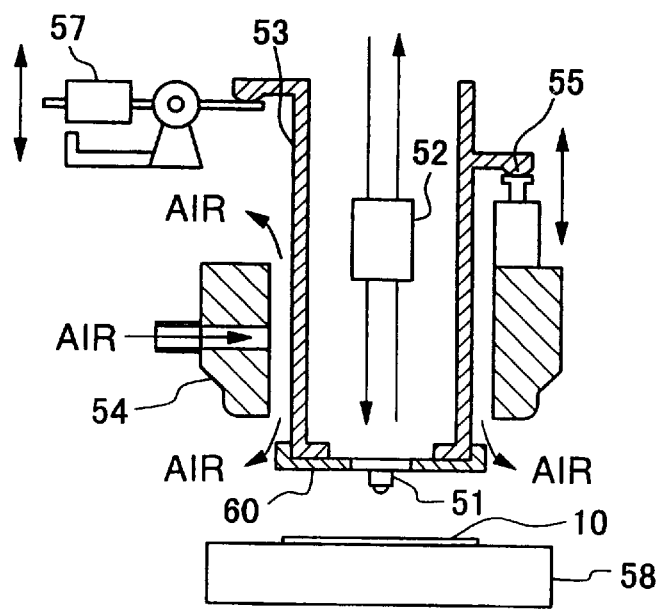
FIG. 7 is a cross-sectional view showing the structure of the conventional electro-optic sampling probe.

In FIG. 3, the numeral 13a denotes a motor fixed at the linear moving base 3a' and the numeral 13b denotes a feed screw directly connected to the motor 13a. The movement of the EO crystal is executed by driving the motor 13a and by rotating the feed screw.

The linear movement may be executed by rectilinearly moving the linear sliding board 3b by means of an eccentric cam.

As described above, the balance mechanism becomes unnecessary in the present system, because the mass of the EO crystal is reduced and because the EO crystal is in contact with the surface of the test object separated from the supporting portion. In addition, the EO crystal can be easily exchanged.

Furthermore, the EO crystal aligning mechanism of the present invention is simple in structure and does not require the precision components required in a conventional alignment mechanism and it is a feature of the present invention that the EO crystal aligning mechanism of the present invention can be operated by operators without having extensive training.

The conventional automatic aligning mechanism is constructed by a complicated structure, since the measurement is executed while the EO crystal 1 is spaced (about 1 $\mu$m) from the test object 10. The complicated mechanism is provided in order to reduce the effect of the disturbance to less than a negligible magnitude. However, the disturbance comes into effect in the range of 100 GHz to 1 THz, and the effect is negligibly small if the wavelength is less than that range, even if the EO crystal is in contact with the test object. Here, the disturbance means the distortion of the waveform or the generation of the reflected waves when the transmission line is long. The disturbance is caused by the EO crystal when it approaches the test object, since the EO crystal used for the electric field sensor has a high dielectric constant, and since the EO crystal is turned into a capacitive load when it approaches the test object.

As described above, the following effects are obtained by the present system when the EO sampling measurement is executed. Specifically, the complicated balance mechanism can be excluded, since the weight of the EO crystal is reduced and the EO crystal can be placed applying only its own weight to the test object; and it is not necessary for an operator to be an experienced operator, since the operation is not placing the EO crystal on the test object by tweezers.

What is claimed is:

1. An electro-optic sampling probe for observing a waveform of a test signal based on the change of the polarization state of a light pulse caused when the light pulse generated by a timing signal is entered into an electro-optic crystal that is coupled with an electric field generated by the test signal, the electro-optic sampling probe comprising:

an electro-optic crystal to receive the light pulse, said crystal having an optical axis and having a stopper portion at an upper portion thereof;

an electro-optic crystal supporting portion for supporting said electro-optic crystal by said stopper portion and capable of moving said electro-optic crystal vertically in the direction of said electro-optic crystal optical axis;

an electro-optic crystal driving portion having a linear base extending in the direction of said electro-optic crystal optical axis and a linear sliding board, to which said electro-optic crystal supporting portion is attached and which slides on said base to carry said supporting portion for rectilinearly moving said electro-optic crystal along the direction of said optical axis.

2. An electro-optic sampling probe according to claim 1, wherein said linear sliding board is moved rectilinearly by a driving lever provided with a fulcrum supported on an observing optical system body.

3. An electro-optic sampling probe according to claim 1, wherein said linear sliding board is moved rectilinearly by a rack and a pinion.

4. An electro-optic sampling probe according to claim 1, wherein said linear sliding board is moved rectilinearly by a motor and a feed screw.

5. An electro-optic sampling probe according to claim 1, wherein said linear sliding board is moved rectilinearly by an eccentric cam.

6. An electro-optic sampling probe according to claim 1 wherein said supporting portion comprises a piece having a hole into which such electro-optic crystal fits with said stopper portion resting on said piece.

7. An electro-optic sampling probe according to claim 6 wherein said stopper portion comprises a flange on said crystal.

8. An electro-optic sampling probe according to claim 6 wherein said piece is transverse to said electro-optic crystal optical axis.

9. An electro-optic sampling probe according to claim 8 wherein said piece is moved along said electro-optic crystal optical axis.

* * * * *